US008086790B2

(12) United States Patent
Roohparvar

(10) Patent No.: US 8,086,790 B2
(45) **Date of Patent: *Dec. 27, 2011**

(54) NON-VOLATILE MEMORY DEVICE HAVING ASSIGNABLE NETWORK IDENTIFICATION

(75) Inventor: Frankie F. Roohparvar, Monte Sereno, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/039,802

(22) Filed: Mar. 3, 2011

(65) Prior Publication Data

US 2011/0153922 A1 Jun. 23, 2011

Related U.S. Application Data

(63) Continuation of application No. 11/973,515, filed on Oct. 9, 2007, now Pat. No. 7,913,033.

(51) Int. Cl.
*G06F 12/00* (2006.01)
*G06F 15/16* (2006.01)

(52) U.S. Cl. ......... 711/103; 711/154; 709/208; 709/226

(58) Field of Classification Search .................. 711/102, 711/103, 154; 709/208, 226
See application file for complete search history.

(56) References Cited

U.S. PATENT DOCUMENTS

| | | | |
|---|---|---|---|
| 5,630,093 | A | 5/1997 | Holzhammer et al. |
| 5,835,935 | A | 11/1998 | Estakhri et al. |
| 6,430,190 | B1 | 8/2002 | Essbaum et al. |
| 6,751,667 | B1 | 6/2004 | Helliwell |
| 6,795,923 | B1 | 9/2004 | Stern et al. |
| 6,819,916 | B1 | 11/2004 | Griffith et al. |
| 6,820,179 | B2 | 11/2004 | Kobayashi et al. |
| 7,471,535 | B2 | 12/2008 | Roohparvar |
| 2004/0148461 | A1 | 7/2004 | Steinmetz et al. |
| 2004/0260864 | A1 | 12/2004 | Lee et al. |
| 2005/0188161 | A1 | 8/2005 | Taguchi |
| 2006/0041728 | A1 | 2/2006 | Taguchi |
| 2006/0047908 | A1 | 3/2006 | Chikusa et al. |
| 2006/0064560 | A1 | 3/2006 | Mizuno et al. |
| 2006/0195650 | A1 | 8/2006 | Su et al. |

*Primary Examiner* — John Lane
(74) *Attorney, Agent, or Firm* — Leffert Jay & Polglaze, P.A.

(57) ABSTRACT

Memory devices and methods disclosed such as a memory device having a plurality of memory dies where each die includes a network identification that uniquely identifies the memory die on a bus. Access for each memory die to the bus can be scheduled by a bus controller.

20 Claims, 8 Drawing Sheets

CONTROLLER
621
NON-VOLITILE MEMORY
600
NETWORK ID
620
BUS CONTROLLER
610
601
603
MICROPROCESSOR
I/O
605

NON-VOLATILE MEMORY DEVICE HAVING ASSIGNABLE NETWORK IDENTIFICATION

RELATED APPLICATION

This is a continuation application of U.S. patent application Ser. No. 11/973,515, filed Oct. 9, 2007 now U.S. Pat. No. 7,913,033 (allowed), titled "NON-VOLATILE MEMORY DEVICE HAVING ASSIGNABLE NETWORK IDENTIFICATION" which is commonly assigned, the entire contents of which are incorporated herein by reference.

TECHNICAL FIELD

The present disclosure relates generally to semiconductor memory and, in a particular embodiment, the present disclosure relates to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
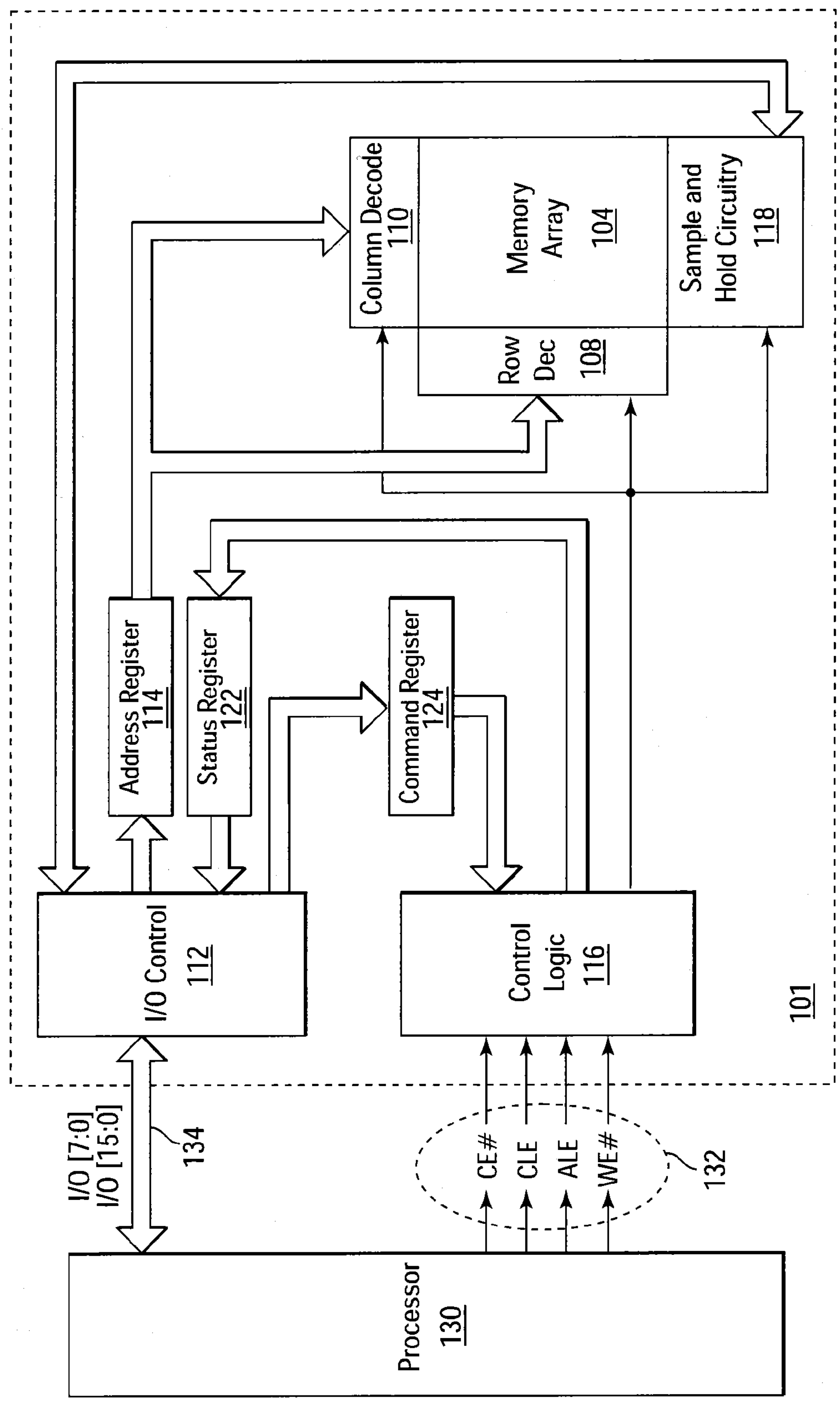
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage ($V_t$) ranges of 200 mV for each range, with each range corresponding to a distinct data state, thereby representing four data values or bit patterns. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the $V_t$ range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as $V_t$ ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
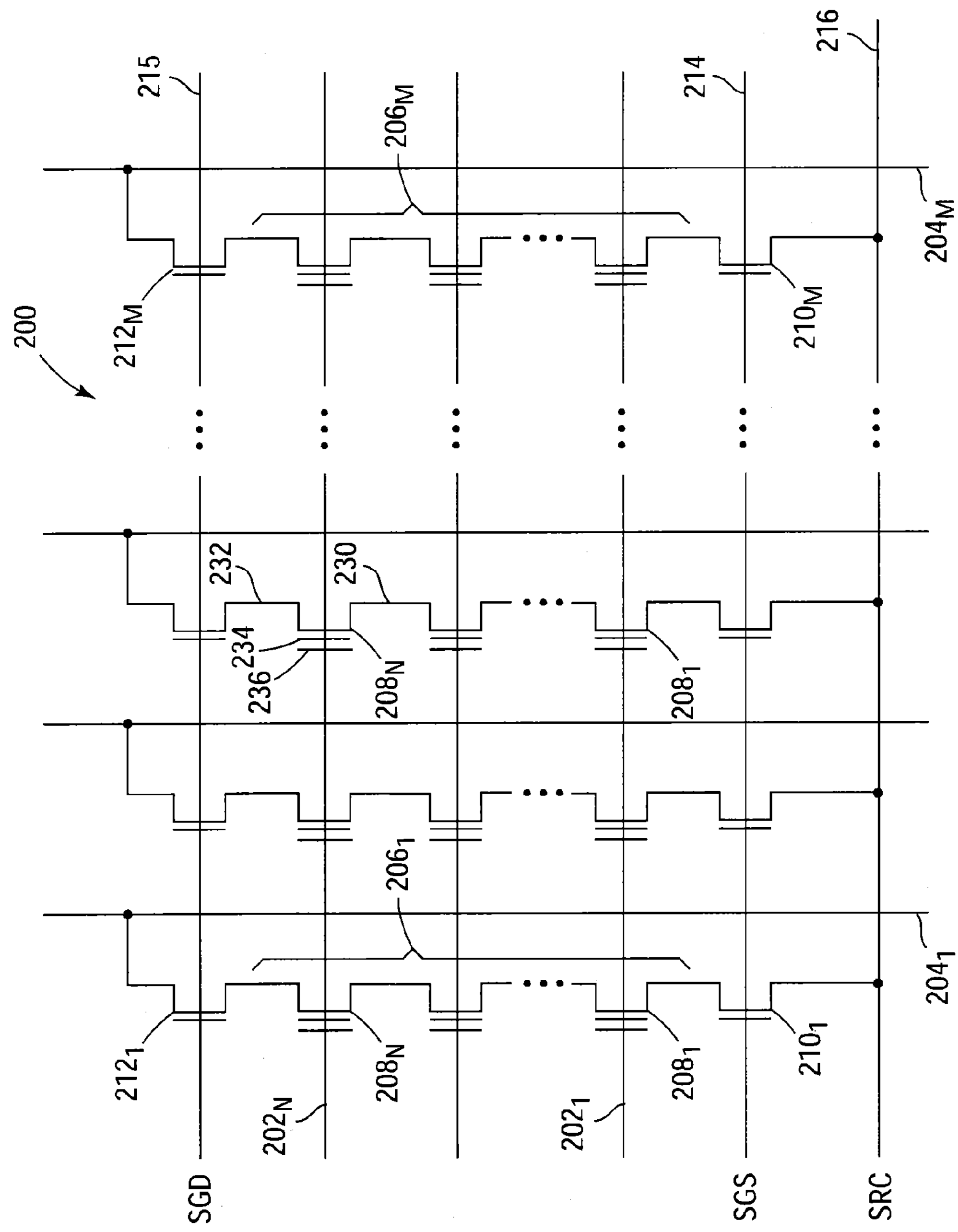
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $\mathbf{202}_1$ to $\mathbf{202}_N$ and intersecting bit lines $\mathbf{204}_1$ to $\mathbf{204}_M$. For ease of addressing in the digital environment, the number of word lines 202 and the number of bit lines 204 are generally each some power of two.

Memory array 200 includes NAND strings $\mathbf{206}_1$ to $\mathbf{206}_M$. Each NAND string includes transistors $\mathbf{208}_1$ to $\mathbf{208}_N$, each located at an intersection of a word line 202 and a bit line 204. The transistors 208, depicted as floating-gate transistors in FIG. 2, represent non volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $\mathbf{210}_1$ is connected to the source of floating-gate transistor $\mathbf{208}_1$ of the corresponding NAND string $\mathbf{206}_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $\mathbf{212}_1$ is connected to the local bit line $\mathbf{204}_1$ for the corresponding NAND string $\mathbf{206}_1$ at a drain contact. The source of each drain select gate 212 is connected to the drain of the last floating-gate transistor 208 of the corresponding NAND string 206. For example, the source of drain select gate $\mathbf{212}_1$ is connected to the drain of floating-gate transistor $\mathbf{208}_N$ of the corresponding NAND string $\mathbf{206}_1$. If multiple drain select gates 212 are utilized for a given NAND string 206, they would be coupled in series between the corresponding bit line 204 and the last floating-gate transistor $\mathbf{208}_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
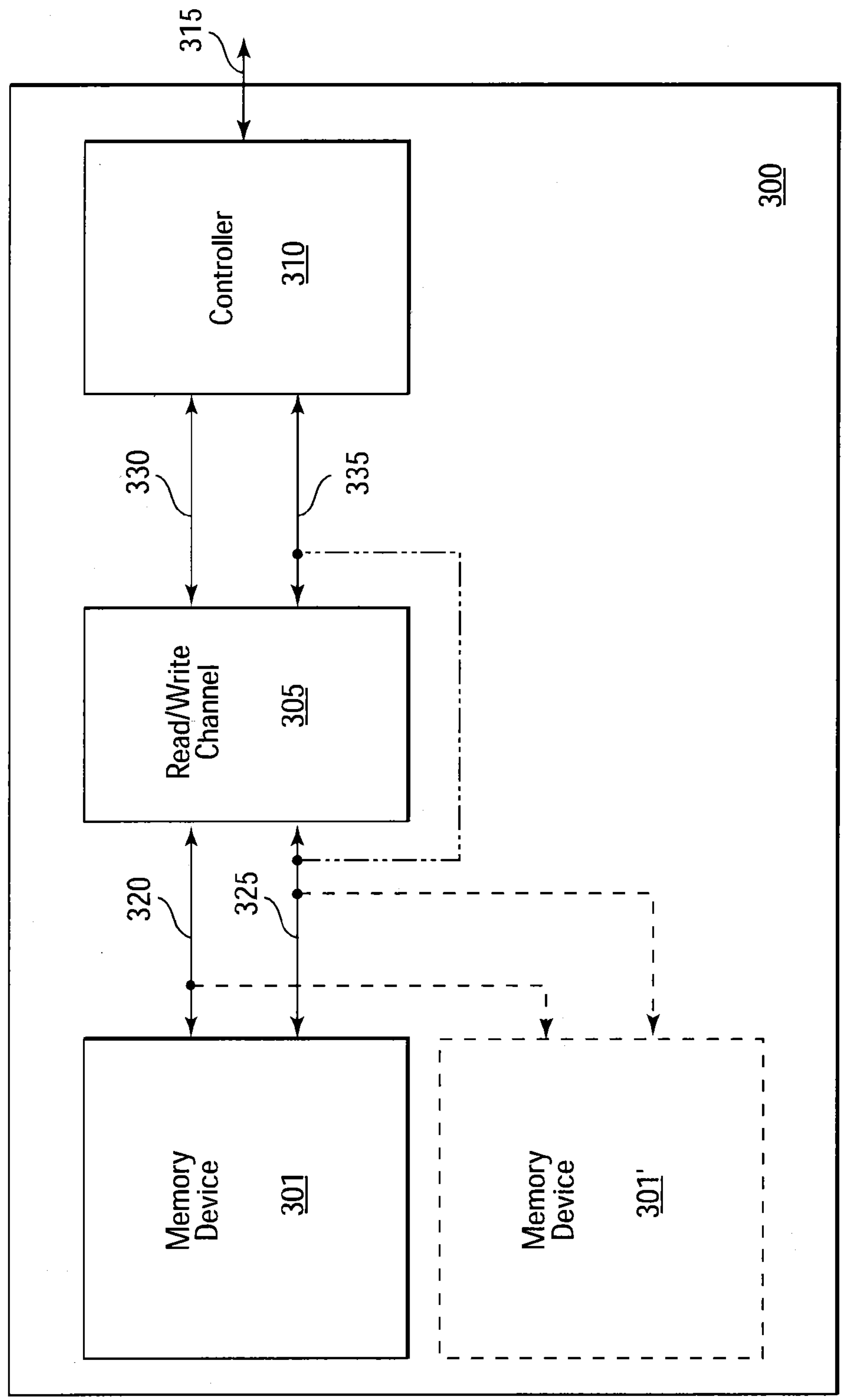
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
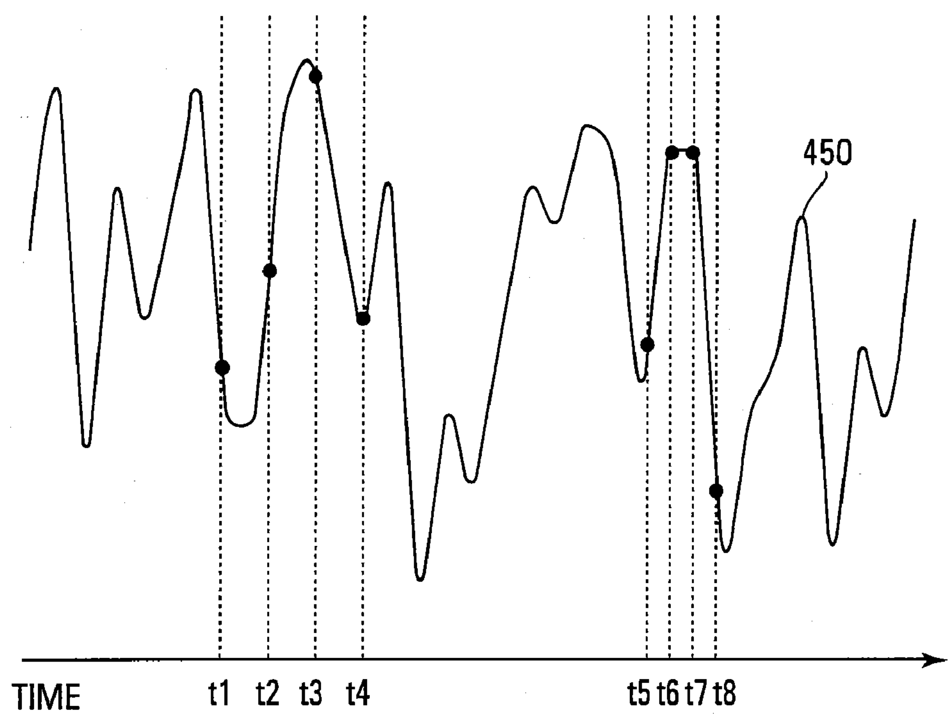
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
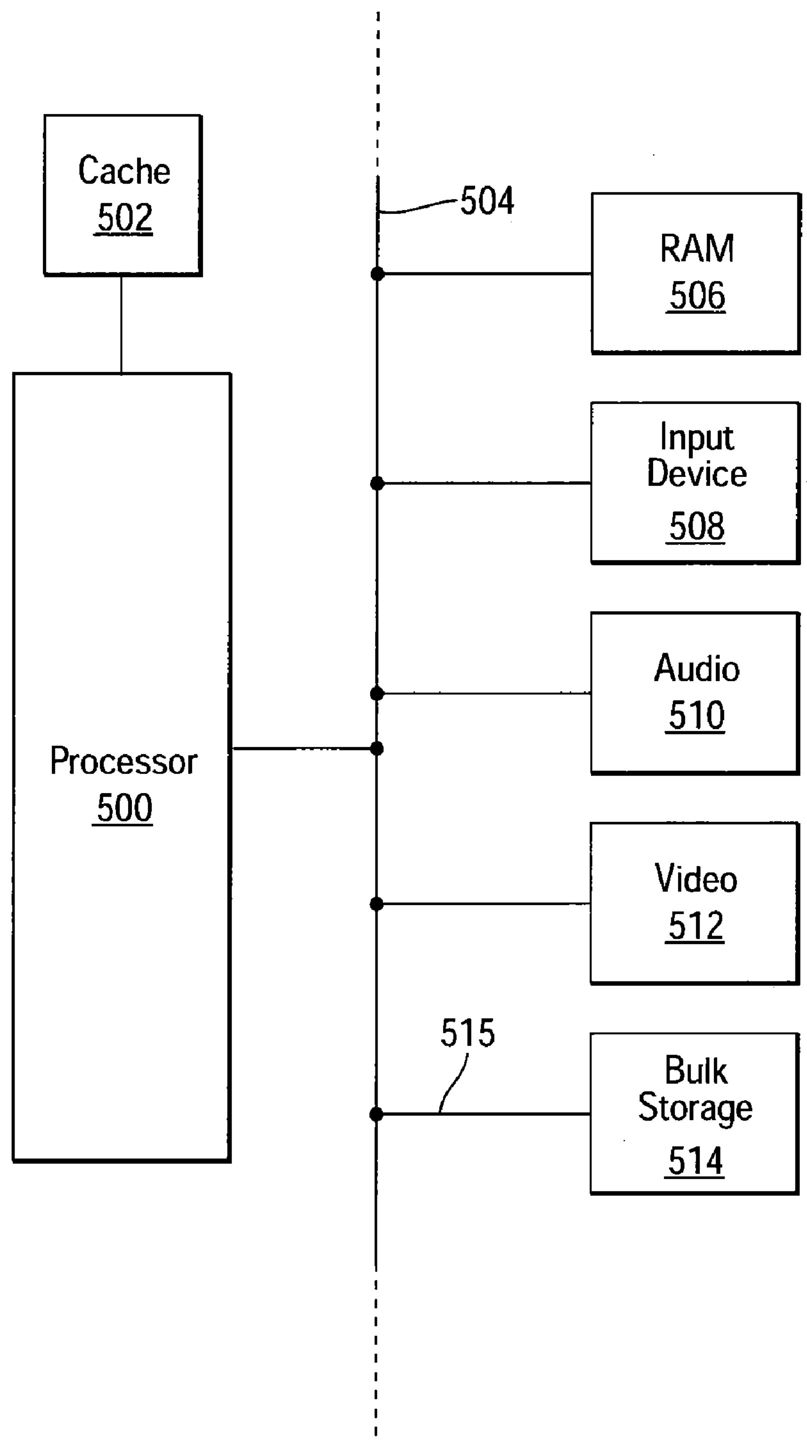
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Non-volatile memory integrated circuits such as flash memory can be made up of multiple stacks of non-volatile memory dies. Each stack can have multiple dies. Thus, one flash memory integrated circuit might have sixteen memory dies in one package if four dies are stacked with four stacks of dies. This can create a problem with communicating with the individual memory dies when the memory controller has to determine which die is being addressed. Additionally, bus contention issues arise when more than one die attempts to access a communication bus simultaneously.

Non-volatile memory devices can be assigned a network identification in order to provide improved network communication capability. With the network ID, a NAND flash memory that would typically be a dumb slave can take control of a communication bus in order to transmit and receive data. The assignment of the network ID makes the memory device an active element of the network.

Figure 6:
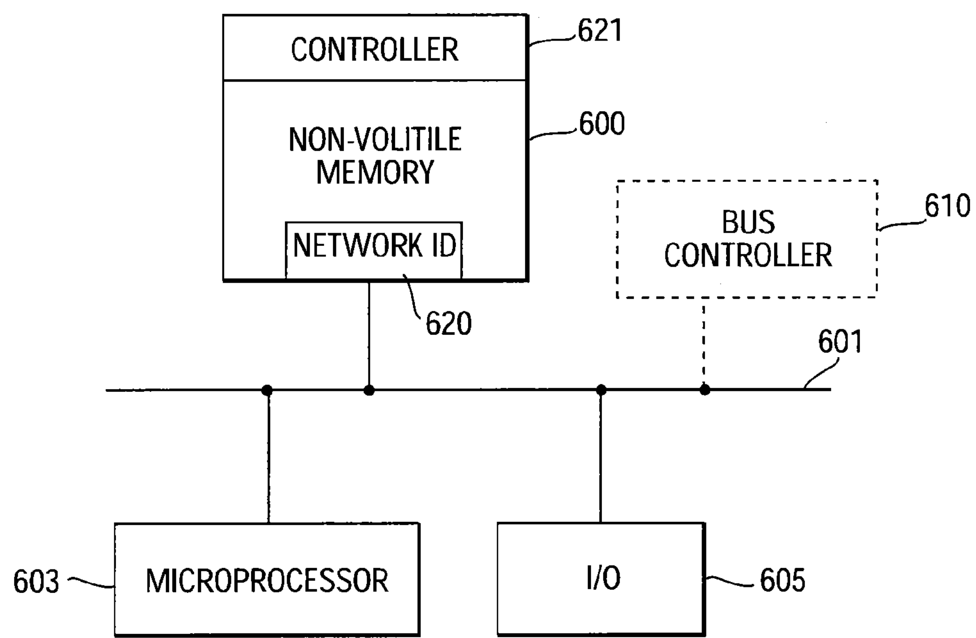
FIG. 6 is a block diagram of one embodiment of a memory system that incorporates a non-volatile memory device with an assigned network ID.

FIG. 6 illustrates a block diagram of one embodiment of a memory system having a non-volatile memory device 600 with an assigned network ID 620 that is embedded in the memory device. The memory device 600 is an integrated circuit that is comprised of at least one memory array made up of a plurality of floating gate, flash memory cells and a memory controller circuit 621. As described previously, the memory arrays can be comprised of a NAND architecture, a NOR architecture, or some other memory array architecture.

The controller circuit 621 is responsible for controlling operation of the memory device 600. The controller 621 generates the control signals for programming, erasing, and reading data to and from the memory array. The controller 621 also controls access with the network bus 601 using the network ID 620 that is assigned to the memory device 600. If an incoming command includes the network ID 620, the operation is performed by the controller circuit 621. Similarly, the controller circuit 621 includes the network ID 620 in outgoing commands to the network.

The network ID 620 for the memory device 600 can be assigned during the manufacturing process. The network ID 620 can be hard coded (i.e., embedded) into an area of the memory that cannot be changed later or it may be loaded into a non-volatile area of memory that can be changed at a later time by the end user. The non-volatile area of memory may be part of the main memory array or a separate non-volatile register that is not part of the main memory array. In another embodiment, the network ID location of the memory device is loaded by the end user while designing the system. Such an embodiment allows the system designer more flexibility in assigning network ID's to the remaining elements of the network.

In an embodiment where the memory device 600 is comprised of multiple memory dies on one integrated circuit, each memory die would have a different network ID so that one integrated circuit could have multiple network ID's assigned. In such an embodiment, each die could access and control the bus 601 individually.

The system of FIG. 6 is also comprised of a microprocessor 603 or other controlling circuit and an input/output circuit 605. The I/O circuit 605 is comprised of circuits that enable input to and output from the memory system. Such I/O circuits 605 can include universal asynchronous receiver transmitter circuits, universal synchronous/asynchronous receiver transmitter circuits, or other types of I/O circuits, either parallel or serial, that enable communication to and from the memory system.

The memory system of FIG. 6 can operate in multiple ways, depending on the bus architecture. For example, a bus controller 610 can be used to control access to the bus 601. When one of the system elements 600, 603, 605 desire to take control of the bus for data transmission or reception, that particular element 600, 603, 605 transmits its network ID to the controller 610 along with any supporting data that might include the amount of data being sent/received or the length of time that the element requires to control the bus. The format and content of the command sent to the bus controller 610 depends on the bus protocol being implemented.

In another embodiment, the bus controller 610 is not an individual element on the bus but is built into each of the other network elements 600, 603, 605. In this embodiment, each network element desiring to take control of the bus broadcasts its unique network ID along with its intentions on the bus. The bus controllers in each of the other network elements 600, 603, 605 receive the command and relinquish control of the bus at a designated time. The format and content of the bus command that is broadcast depends on the bus protocol being implemented.

The use of the network ID in the non-volatile memory device 600 is not limited to a multiple network element system. The network ID can be used by the memory controller 621 internally to the memory integrated circuit 600 to determine which one of multiple memory dies has access to the I/O pins of the integrated circuit. If the memory device is comprised of multiple memory dies tied to an internal data bus, an internal bus controller can control access to the internal bus in the same manner as an external controller controls access to an external bus. Each individual memory die broadcasts its network ID to the chip controller with the amount of data to be transmitted/received or the length of time the bus is required. The chip controller then schedules access to the internal bus amongst the internal memory dies. The controller transmits the access scheduled back to each requesting die or transmits a proceed command to each die at the time that that particular die can access the bus without contention.

Figure 7:
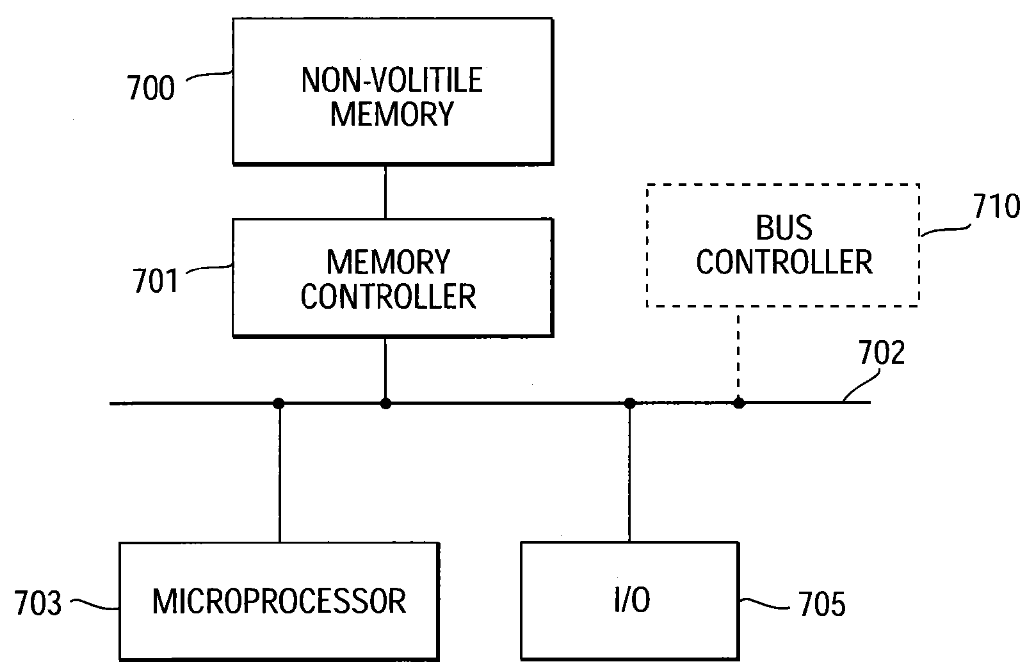
FIG. 7 is a block diagram of an alternate embodiment of a memory system that incorporates a non-volatile memory device with an assigned network ID.

FIG. 7 illustrates an alternate embodiment of a memory system of the present disclosure. This memory system includes a non-volatile memory device 700 (e.g., NAND flash memory) that acts as a solid state drive as described previously. The system is further comprised of a controller circuit 703 (e.g., microprocessor), an I/O block 705, and an optional bus controller 710. The embodiment of FIG. 7 includes a separate memory controller circuit 701 between the solid state drive 700 and the bus 702.

The memory controller circuit 701 is responsible for performing the functions normally performed by a magnetic drive controller. The controller 701 functions include controlling the flash memory functions, wear leveling, and error correction.

The flash memory functions performed by the controller 701 include generating the control signals required by the memory cells for writing, erasing, and reading the memory cells. The various word line and bit line signals required to perform these functions are described in greater detail in previous embodiments.

The controller 701 also performs a wear leveling function for the solid state drive 700. This function increases the life span and reliability of the solid state drive by ensuring that all areas of each memory array are used substantially equally since each memory array is comprised of floating gate memory cells that have a limited life span (e.g., 100 k write cycles). The wear leveling function is comprised of the controller circuit 701 receiving a logical memory address from the system bus 702 and translating that address into a physical address for the memory array or arrays. This allows the controller circuit 701 to move the programmed cells around in response to their frequency of use.

The error correction provided by the controller circuit 701 can be any type of error correction such as the correction used in solid state memory devices or magnetic hard drives. These types of error correction codes include Hamming code and Reed-Solomon.

Figure 8:
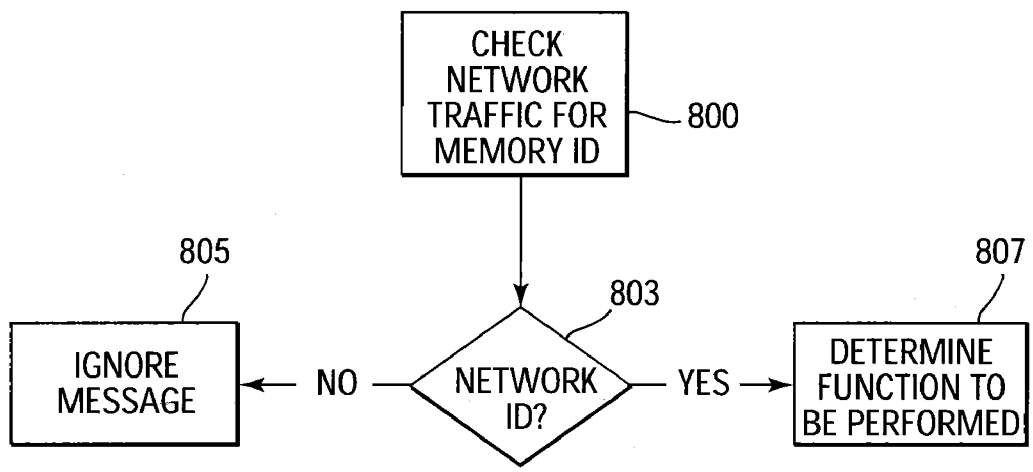
FIG. 8 is a flowchart of one embodiment of a method for a non-volatile memory device with an assigned network ID to receive a message over a network.

FIG. 8 illustrates a flowchart of one embodiment of a method for a non-volatile memory device having an assigned network ID to receive a message from a network. The memory controller checks each message of the network traffic for the unique network ID for the memory device or devices that it is controlling 800. The memory controller can be either the on-chip memory controller that controls one or more memory arrays on the integrated circuit or the external memory controller that is separate from the memory device but between the memory device and the bus.

When the network ID that is found in the received bus messages matches that of the array or arrays under the control of the memory controller 803, the function specified by the message is performed 807. If the network ID does not match any of the memory array ID's 803, the message is ignored 805 and the controller continues to monitor the bus traffic.

Figure 9:
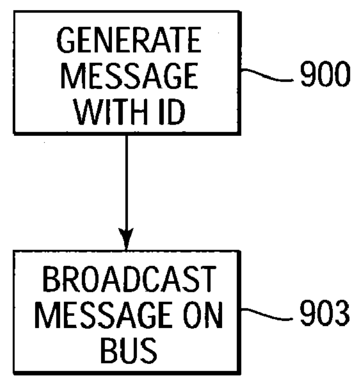
FIG. 9 is a flowchart of one embodiment of a method for a non-volatile memory device with an assigned network ID to transmit a message over a network.

Since the assignable network ID gives the memory device the ability to be an active network element, the memory controller can generate messages requesting data from the network. One embodiment of such a method is illustrated in FIG. 9.

This method first generates the message that includes the requesting memory array's ID. Such a memory function message can include a request for data to be transmitted to the requesting memory device and stored in the array. The message can also be a request that a certain network element be prepared to accept data from the memory device. This message is broadcast on the network 903 for the other network elements to receive.

CONCLUSION

The embodiments of the present disclosure provide a network identification to a non-volatile memory device connected to a bus structure. The network ID enables the non-volatile memory device to operate as an active network element instead of a dumb, slaved device. This allows the non-volatile memory device to not only receive data from other network elements but the device can also actively request data.

What is claimed is:

1. A memory device comprising:

a plurality of memory dies, each die having a different network identifier that uniquely identifies its respective memory die;

an internal data bus coupled to the plurality of memory dies;

a memory controller configured to control access to the internal data bus by each memory die responsive to the respective network identifier of each memory die.

2. The memory device of claim 1 wherein each network identifier is hard coded into its respective memory die.

3. The memory device of claim 1 and further including a plurality of input/output pins coupled to the internal data bus wherein the memory controller is configured to control access to the plurality of input/output pins by each memory die responsive to the respective network identifier of each memory die.

4. The memory device of claim 1 wherein each network identifier is loadable into its respective memory die.

5. The memory device of claim 1 wherein each memory die comprises an array of non-volatile memory cells.

6. The memory device of claim 1 wherein the array of non-volatile memory cells are floating gate memory cells.

7. The memory device of claim 1 wherein each memory die is configured to broadcast its respective network identifier to the memory controller.

8. The memory device of claim 7 wherein each memory die is further configured to broadcast an amount of data to be transmitted or received on the internal data bus.

9. The memory device of claim 7 wherein each memory die is further configured to broadcast an amount of time to be coupled to the internal data bus.

10. The memory device of claim 7 wherein the memory controller is further configured to schedule access to the internal data bus amongst the plurality of memory dies.

11. The memory device of claim 1 wherein each network identifier is loaded into its respective memory die by an end user.

12. A memory device comprising:

a plurality of memory dies, each die comprising:

a unique network identifier that identifies its respective memory die; and a bus controller;

an internal data bus coupled to each memory die;

wherein each bus controller is configured to control access to the internal data bus by each memory die responsive to the respective network identifier of each memory die.

13. The memory device of claim 12 wherein each memory die is configured to broadcast its unique network identification and intentions of the memory die on the internal data bus.

14. The memory device of claim 13 wherein each bus controller is configured to receive broadcast network identifications and relinquish control of the internal data bus at a designated time.

15. The memory device of claim 13 wherein a format of the broadcast is responsive to a bus protocol of the respective bus controller.

16. A method for communicating over an internal data bus of a memory device, the method comprising:

a memory die of a plurality of memory dies, each memory die comprising a unique network identification, broadcasting its respective network identification to a bus controller; and the bus controller enabling access to the internal data bus responsive to the network identification.

17. The method of claim 16 and further comprising the bus controller generating an access schedule for access to the internal data bus by the plurality of memory dies.

18. The method of claim 17 and further comprising transmitting the access schedule to the plurality of memory dies.

19. The method of claim 17 and further comprising transmitting a proceed command to a requesting memory die of the plurality of memory dies responsive to the respective network identification of the requesting memory die and the access schedule.

20. The method of claim 16 and further comprising the memory die transmitting an amount of data or length of time to access the internal data bus with the respective network identification.

* * * * *